United States Patent
Ho et al.

(10) Patent No.: US 8,164,914 B2
(45) Date of Patent: Apr. 24, 2012

(54) CIRCUIT BOARD FIXING DEVICE

(75) Inventors: Kun-Ta Ho, Hsinchu (TW); Yung-Lung Lee, Hsinchu (TW); Chun-Lung Ho, Hsinchu (TW)

(73) Assignee: Philips & Lite-On Digital Solutions Corporation, Hsinchu (TW)

( * ) Notice: Subject to any disclaimer, the term of this patent is extended or adjusted under 35 U.S.C. 154(b) by 190 days.

(21) Appl. No.: 12/834,034

(22) Filed: Jul. 12, 2010

(65) Prior Publication Data

US 2011/0222251 A1 Sep. 15, 2011

(30) Foreign Application Priority Data

Mar. 12, 2010 (CN) .......................... 2010 1 0136541

(51) Int. Cl.
*H05K 7/12* (2006.01)
(52) U.S. Cl. ........ 361/759; 361/801; 361/807; 361/809; 439/547
(58) Field of Classification Search .................. 361/759, 361/801, 807, 809, 740, 747; 439/545, 547, 439/549
See application file for complete search history.

(56) References Cited

U.S. PATENT DOCUMENTS

| | | | | |
|---|---|---|---|---|
| 5,398,156 A * | 3/1995 | Steffes et al. | ............ | 361/679.58 |
| 5,732,450 A * | 3/1998 | Quah et al. | ...................... | 24/297 |
| 5,796,593 A * | 8/1998 | Mills et al. | .................... | 361/801 |
| 6,005,775 A * | 12/1999 | Chiu | .............................. | 361/752 |
| 6,428,352 B1 * | 8/2002 | Boyden | .......................... | 439/545 |
| 6,603,669 B2 * | 8/2003 | Sheen et al. | ................... | 361/801 |
| 6,751,102 B1 * | 6/2004 | Chen | .............................. | 361/758 |
| 7,040,905 B1 * | 5/2006 | Wang | ............................ | 439/76.1 |
| 7,364,437 B2 * | 4/2008 | Xu et al. | ...................... | 439/76.1 |
| 7,583,517 B2 * | 9/2009 | Hartman et al. | ............... | 361/810 |
| 7,679,859 B2 * | 3/2010 | Hayakawa et al. | ......... | 360/99.24 |
| 7,715,202 B2 * | 5/2010 | Morita | ........................... | 361/759 |
| 8,031,483 B2 * | 10/2011 | Hsiao et al. | ................... | 361/807 |

FOREIGN PATENT DOCUMENTS

DE 102010019020 * 5/2010

* cited by examiner

*Primary Examiner* — Dameon Levi
(74) *Attorney, Agent, or Firm* — Thomas, Kayden, Horstemeyer & Risley, LLP

(57) ABSTRACT

The present invention discloses a circuit board fixing device for fixing a circuit board. The device comprises a chassis for supporting the circuit board, at least one first hook setting on the supporting surface, and at least one second hook setting on the supporting surface. The first hook has a first contact surface for clamping a first type circuit board on the supporting surface. A first distance is between the first contact surface and the supporting surface. Additionally, the second hook has a second contact surface for clamping a second type circuit board on the supporting surface. A second distance is between the second contact surface and the supporting surface. The thickness of the first type circuit board is thicker than that of the second type circuit board, and the first distance is larger than the second distance.

9 Claims, 5 Drawing Sheets

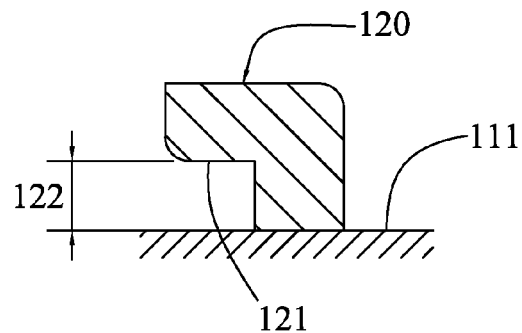 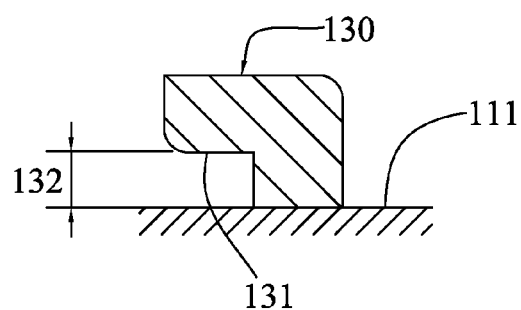
FIG. 3A        FIG. 3B
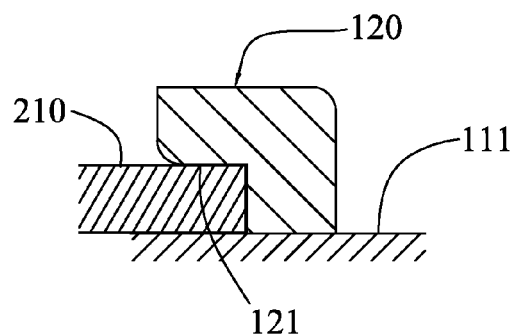 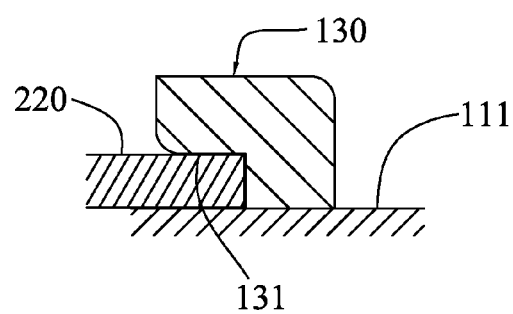
FIG. 4A        FIG. 4B
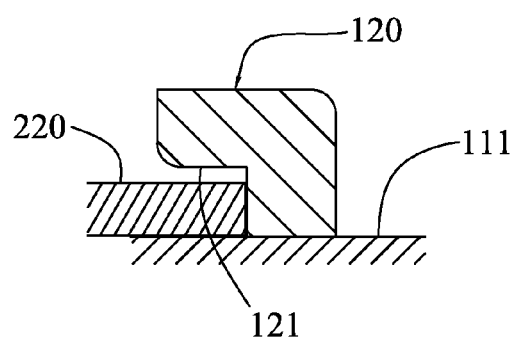 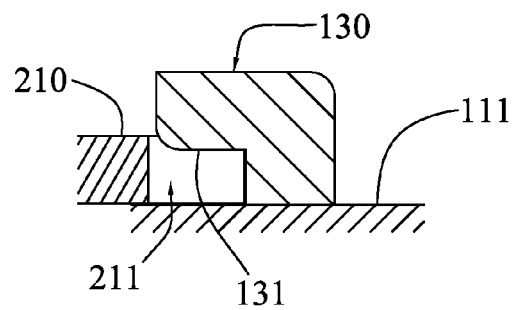
FIG. 5A        FIG. 5B

CIRCUIT BOARD FIXING DEVICE

This application claims the benefit of People's Republic of China application Serial No. 201010136541.9, filed Mar. 12, 2010, the subject matter of which is incorporated herein by reference.

FIELD OF THE INVENTION

The present invention relates to a circuit board fixing device, particularly, to the circuit board fixing device for fixing a circuit board with various thicknesses.

BACKGROUND OF THE INVENTION

Generally speaking, the electronic product usually comprises a circuit board to control and operate the electronic product. And, the circuit board is usually fixed on the electronic product by screws. However, tightening the screws to fix the circuit board on the electronic product needs time and extra cost for the screws.

In order to reduce the cost and improve the competitiveness, in some electronic products, the circuit board is fixed on the electronic product without screws. For example, a chassis of the electronic product may include several hooks for fixing the circuit board on it. However, in the above application, the several hooks are designed for fixing the circuit board with specific thickness. It may not be a problem that only the circuit board with specific thickness can be fixed in the past. However, as the technology is improving, the circuit boards have various sizes or thicknesses, and it will result in the increase of the cost to have different designs for different circuit boards with different sizes or thicknesses.

SUMMARY OF THE INVENTION

The present invention discloses a circuit board fixing device for fixing a circuit board with various thicknesses.

The present invention discloses a circuit board fixing device comprising a chassis for supporting a circuit board, at least one first hook setting on said supporting surface, and at least one second hook setting on said supporting surface. The first hook has a first contact surface for clamping a first type circuit board on the supporting surface. A first distance is between the first contact surface and the supporting surface. The second hook has a second contact surface for clamping a second type circuit board on the supporting surface. A second distance is between the second contact surface and the supporting surface. The thickness of the first type circuit board is thicker than that of the second type circuit board, and the first distance is larger than the second distance.

The present invention further discloses a circuit board fixing device comprising a chassis for supporting the circuit board and at least one first hook setting on said supporting surface. The first hook has a first contact surface for clamping a first type circuit board on the supporting surface. The first hook further comprises a salient protruding from the first contact surface. The salient has a third contact surface for clamping a second type circuit board on the supporting surface. The thickness of the first type circuit board is thicker than that of the second type circuit board.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3A to FIG. 3B show schematically diagrams for a cross-section of a first hook and a second hook of the first embodiment of the present invention;

FIG. 4A shows a schematically diagram for the first hook assembled with a first type circuit board of the first embodiment of the present invention;

FIG. 4B shows a schematically diagram for the second hook assembled with a second type circuit board of the first embodiment of the present invention;

FIG. 5A shows a schematically diagram for the first hook assembled with the second type circuit board of the first embodiment of the present invention;

FIG. 5B shows a schematically diagram for the second hook assembled with the first type circuit board of the first embodiment of the present invention;

DETAILED DESCRIPTION OF THE PREFERRED EMBODIMENT

In order to describe the present invention more clearly, the description with the figures will be described as follows.

Figure 1:
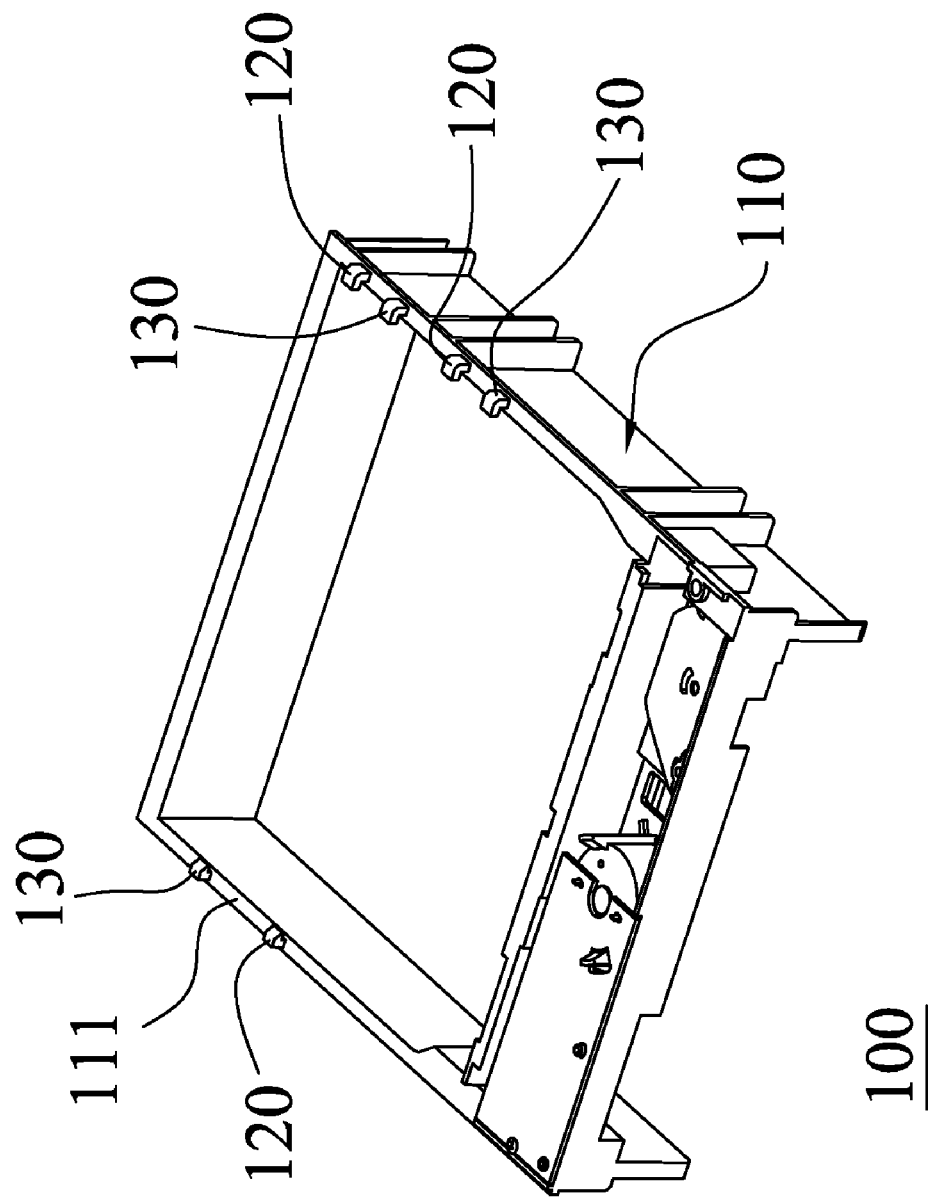
FIG. 1 shows a schematically diagram for a circuit board fixing device of a first embodiment of the present invention.
Figure 2:
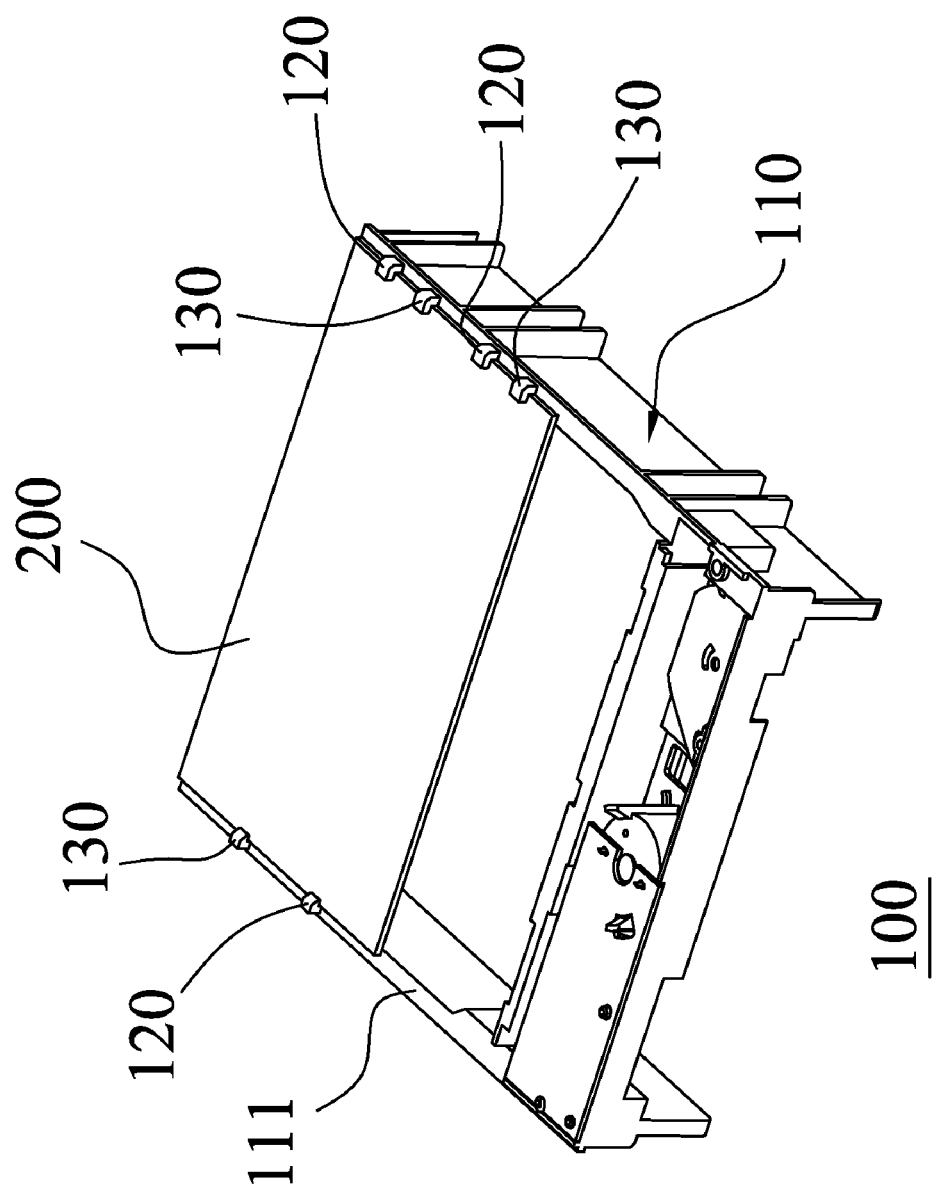
FIG. 2 shows a schematically diagram for the circuit board fixing device fixing a circuit board of the first embodiment of the present invention.

Please refer to FIG. 1 and FIG. 2. FIG. 1 shows a schematically diagram for a circuit board fixing device 100 according to a first embodiment of the present invention; FIG. 2 shows a schematically diagram for the circuit board fixing device 100 and a circuit board 200 according to the first embodiment of the present invention. In the first embodiment, the circuit board fixing device 100 comprises a chassis 110, at least one first hook 120 and at least one second hook 130. The chassis 110 has a supporting surface 111 for supporting the circuit board 200 as shown in FIG. 2.

Please refer to FIG. 3A and FIG. 3B. FIG. 3A shows a schematically diagram for a cross-section of the first hook 120; FIG. 3B shows a schematically diagram for a cross-section of the second hook 130. The first hook 120 is set on the supporting surface 111 of the chassis 110 and has a first contact surface 121 for clamping a first type circuit board 210 together with the supporting surface 111 as shown in FIG. 4A. A distance between the first contact surface 121 and supporting surface 111 is called a first distance 122. Similarly, the second hook 130 is set on the supporting surface 111 of the chassis 110 and has a second contact surface 131 for clamping a second type circuit board 220 together with the supporting surface 111 as shown in FIG. 4B. A distance between the second contact surface 131 and the supporting surface 111 is called a second distance 132. In this embodiment of the present invention, the first distance 122 is larger than the second distance 132, and the thickness of the first type circuit board 210 is thicker than that of the second type circuit board 220.

Please refer to FIG. 4A and FIG. 4B. FIG. 4A shows a schematically diagram for the first hook 120 assembled with the first type circuit board 210; FIG. 4B shows a schematically diagram for the second hook 130 assembled with the second type circuit board 220. The first type circuit board 210 can be clamped between the first contact surface 121 and the supporting surface 111, and the second type circuit board 220 can be clamped between the second contact surface 132 and the supporting surface 111. According to the first embodiment of the present invention, when the second type circuit board 220 is assembled to the circuit board fixing device 100, the second hook 130 clamps the second type circuit board 220 on the supporting surface 111, and the first contact surface 121 of the first hook 120 does not contact the second type circuit board 220 as shown in FIG. 5A. FIG. 5A shows a schematically diagram for the first hook 120 assembled with the second type circuit board 220 of the first embodiment of the present invention. Alternatively, when the first type circuit board 210 is assembled to the circuit fixing device 100, the first hook 120 clamps the first type circuit board 210 on the supporting surface 111, and the second hook 130 is contained in a space 211 formed on the first type circuit board 210 as shown in FIG. 5B. FIG. 5B shows a schematically diagram for the second hook 130 assembled with the first type circuit board 210 of the first embodiment of the present invention. The space 211 is formed on the first type circuit board 210 at a position corresponding to the position of the second hook 130.

In a preferred embodiment, the circuit board fixing device 100 is formed by injection molding, wherein the chassis 110, the first hook 120 and the second hook 130 are formed integral.

In a preferred embodiment, the chassis 110 is a frame structure. However, the structure of the chassis is not limited, and it can be any structure having a supporting surface for supporting the circuit board.

In a preferred embodiment, the circuit board fixing device 100 comprises three first hooks 120 and three second hook 130 as shown in FIG. 1. However, the amount of the first hook 120 and the second hook 130 is not limited in three. The actual amount of the hooks can be designed according to the actual implement.

Figure 6:
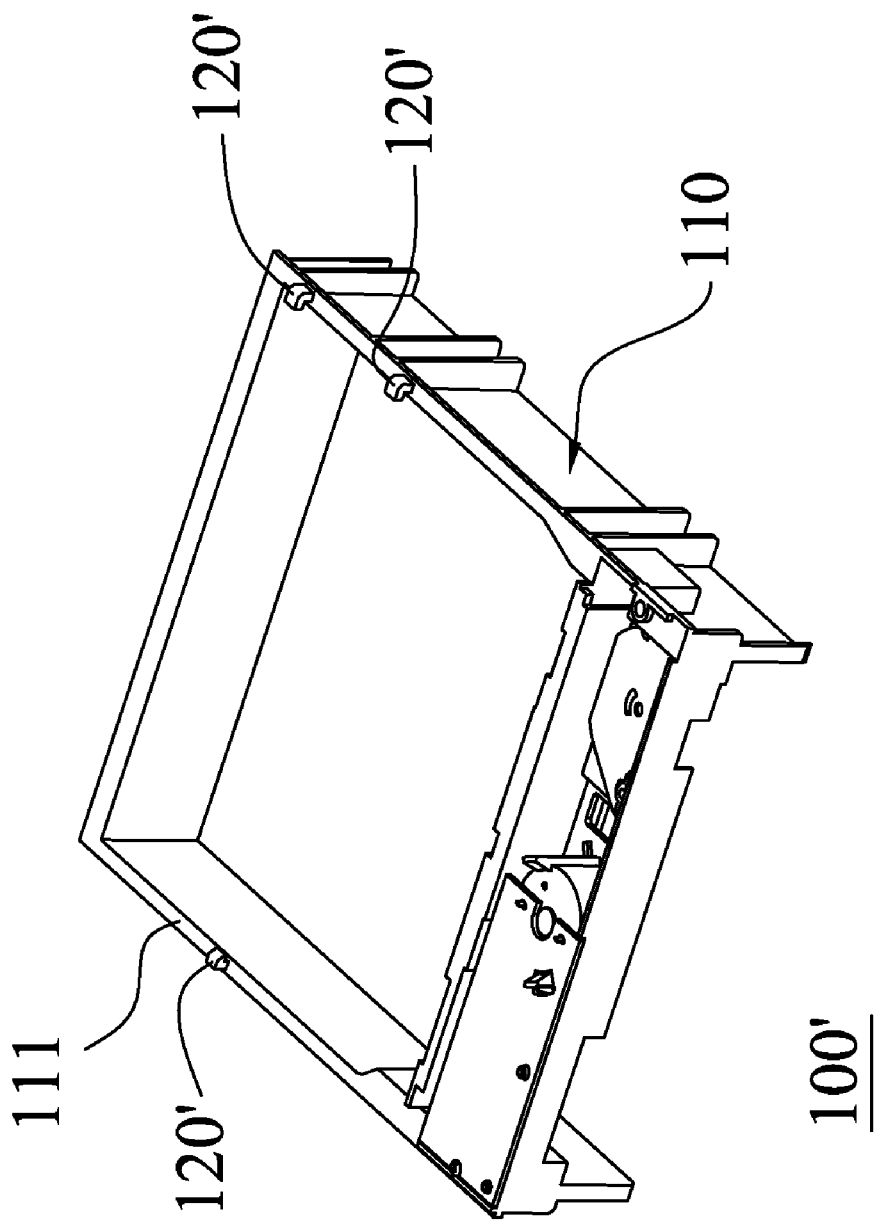
FIG. 6 shows a schematically diagram for a circuit board fixing device of a second embodiment of the present invention.
Figure 7A:
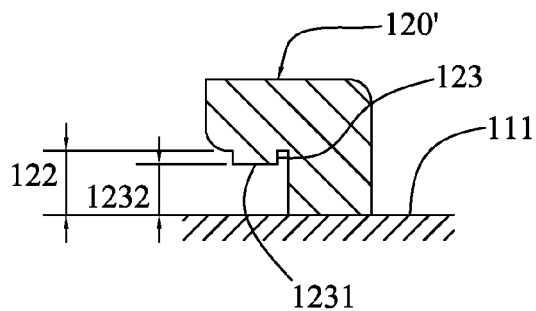
FIG. 7A to FIG. 7B show a schematically diagram for a cross-section of a first hook of the second embodiment of the present invention.
Figure 7B:
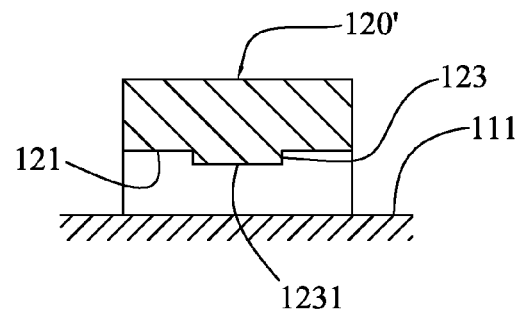
Figure 9A:
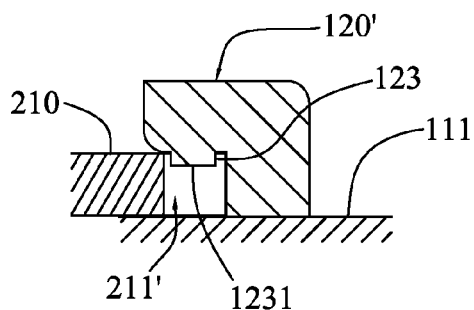
FIG. 9A to 9B show schematically diagrams for a front view and a lateral view of the first hook assembled with a first type circuit board of the second embodiment of the present invention.
Figure 9B:
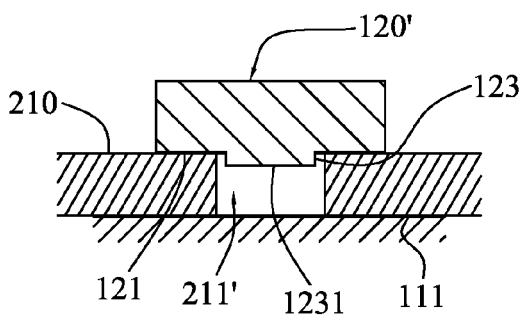

Please refer to FIG. 6, FIG. 7A and FIG. 7B. FIG. 6 shows the schematically diagram for a circuit board fixing device 100' of a second embodiment of the present invention; FIG. 7A and 7B respectively show the schematically diagram for a cross-section of a first hook 120' in different directions. In the second embodiment, the circuit board fixing device 100' comprises a chassis 110 and at least one first hook 120', wherein the chassis 110 comprises a supporting surface 111 for supporting a circuit board. The first hook 120' is set on the supporting surface 111 and has a first contact surface 121 for clamping the first type circuit board 210 together with the supporting surface 111 as shown in FIG. 9A and 9B. The first distance 122 is between the first contact surface 121 and the supporting surface 111. In the first and the second embodiments, the corresponding components are marked with the same numbers. The different between the first and the second embodiments is that the first hook 120' of the second embodiment has a salient 123 protruded on the first contact surface 121 to replace the second hook of the first embodiment.

Figure 8A:
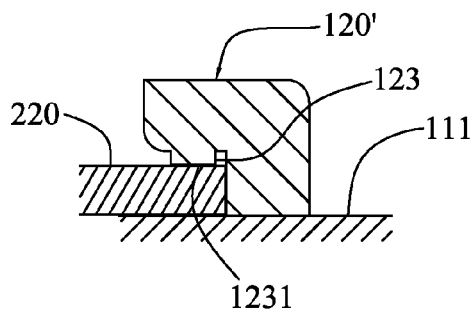
FIG. 8A to 8B show the schematically diagrams for a front view and a lateral view of the first hook assembled with a second type circuit board of the second embodiment of the present invention.
Figure 8B:
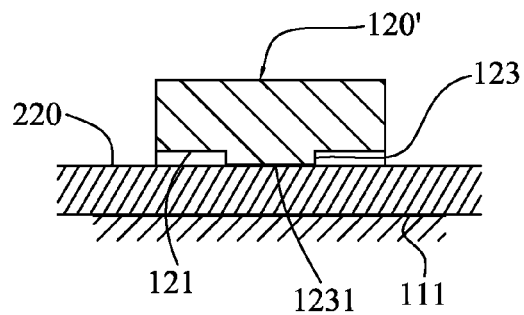

As shown in FIGS. 7A and 7B, the salient 123 is protruded from the first contact surface 121 to the supporting surface 111. The salient 123 has a third contact surface 1231 for clamping the second type circuit board 220 together with the supporting surface 111 as shown in FIG. 8A and 8B. A third distance 1232 is between the third contact surface 1231 and the supporting surface 111, and the first distance 122 is larger than the third distance 1232. The third distance 1232 in the second embodiment is the same with the second distance 132 for clamping the second type circuit board 220.

FIGS. 8A and 8B show the schematically diagrams for the front view and the lateral view of the first hook 120' assembled with the second type circuit board 220 of the second embodiment. FIG. 9A and 9B show the schematically diagrams for the front view and the lateral view of the first hook 120' assembled with the first type circuit board 210 of the second embodiment. According to the second embodiment, the first type circuit board 210 is clamped between the first contact surface 121 and supporting surface 111, and the second type circuit board 220 is clamped between the third contact surface 1231 of the salient 123 and the supporting surface 111. When the second type circuit board 220 is assembled to the circuit fixing device 100, the salient 123 clamps the second type circuit board 220 on the supporting surface 111 of the chassis 110, and the first contact surface 121 of the first hook 120' does not contact with the second type circuit board 220 as shown in FIGS. 8A and 8B. Alternatively, when the first type circuit board 210 is assembled to the circuit fixing device 100, the first contact surface 121 of the first hook 120' clamps the first type circuit board 210 on the supporting surface 111 of the chassis 110, and the salient 123 is contained in a space 211' formed on the first type circuit board 210 as shown in FIGS. 9A and 9B. The space 211' is formed on the first type circuit board 210 at a position corresponding to the position of the salient 123.

In a preferred embodiment, the circuit board fixing device 100' is formed by injection molding, wherein the chassis 110 and the first hook 120' are formed integral.

In a preferred embodiment, the chassis 110 is a frame structure. However, the structure of the chassis is not limited, and it can be any structure having a supporting surface for supporting the circuit board.

In a preferred embodiment, the circuit board fixing device 100' comprises three first hooks 120' as shown in FIG. 6. The actual amount of the first hooks 120' can be designed according to the actual implement.

According to the present invention, the circuit board fixing device is provided to only need single mold design and is suitable for at least two kind of thicknesses of circuit boards, therefore reducing the amount of screws, cost and assembling time.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:
1. A circuit board fixing device for fixing a circuit board, said circuit board fixing device comprising:
   a chassis having a supporting surface for supporting said circuit board;
   at least one first hook having a first contact surface and setting on said supporting surface, wherein said first contact surface and said supporting surface clamps a first type circuit board, and a first distance is between said first contact surface and said supporting surface; and at least one second hook having a second contact surface and setting on said supporting surface, wherein said second contact surface and said supporting surface clamps a second type circuit board, and a second distance is between said second contact surface and said supporting surface;

wherein the thickness of said first type circuit board is thicker than that of said second type circuit board, and said first distance is larger than said second distance.

2. The circuit board fixing device according to claim 1, wherein said chassis, said first hook and said second hook are formed integral.

3. The circuit board fixing device according to claim 1, wherein said chassis is a frame structure.

4. The circuit board fixing device according to claim 1, wherein when said first type circuit board is assembled to the circuit fixing device, said first contact surface of the first hook clamps said first type circuit board together with said supporting surface of said chassis, and said second hook is contained in a space formed on said first type circuit board.

5. The circuit board fixing device according to claim 1, wherein said first contact surface of the first hook further comprises a salient, wherein said salient has a third contact surface for clamping said second type circuit board.

6. The circuit board fixing device according to claim 5, wherein when said first type circuit board is assembled to the circuit fixing device, said first contact surface of the first hook clamps said first type circuit board together with said supporting surface of said chassis, and said salient is contained in a space formed on said first type circuit board.

7. A circuit board fixing device for fixing a circuit board, said circuit board fixing device comprising:

a chassis having a supporting surface for supporting said circuit board; and at least one first hook having a first contact surface and setting on said supporting surface, wherein said first contact surface and said supporting surface clamps a first type circuit board, and a first distance is between said first contact surface and said supporting surface;

wherein said first hook further comprises a salient protruding from said first contact surface, and said salient has a third contact surface for clamping a second type circuit board together with said supporting surface, and a third distance is between said third contact surface and said supporting surface;

wherein the thickness of said first type circuit board is thicker than that of said second type circuit board, and said first distance is larger than said third distance.

8. The circuit board fixing device according to claim 1, wherein said chassis and said first hook are formed integral.

9. The circuit board fixing device according to claim 7, wherein when said first type circuit board is assembled to the circuit fixing device, said first contact surface of the first hook clamps said first type circuit board together with said supporting surface of said chassis, and said salient is contained in a space formed on said first type circuit board.

* * * * *